US008868365B2

(12) United States Patent
Huang et al.

(10) Patent No.: US 8,868,365 B2
(45) Date of Patent: Oct. 21, 2014

(54) SYSTEM AND METHOD OF GENERATING EXTERNAL PARAMETER VALUE FOR SEPARATELY EXCITED MOTOR CONTROLLER

(75) Inventors: Rijun Huang, Guangxi (CN); Yulin Su, Guangxi (CN); Ben Cai, Guangxi (CN); Yanzhang Ye, Guangxi (CN)

(73) Assignee: Liuzhou Wuling Motors Co., Ltd. (CN)

( * ) Notice: Subject to any disclaimer, the term of this patent is extended or adjusted under 35 U.S.C. 154(b) by 682 days.

(21) Appl. No.: 13/165,987

(22) Filed: Jun. 22, 2011

(65) Prior Publication Data

US 2012/0130668 A1 May 24, 2012

(30) Foreign Application Priority Data

Nov. 22, 2010 (CN) .......................... 2010 1 0554589

(51) Int. Cl.
 *H03M 1/10* (2006.01)
 *G01D 18/00* (2006.01)
 *G06F 3/05* (2006.01)
 *G06F 11/00* (2006.01)
 *G06F 19/00* (2011.01)
 *H02P 23/14* (2006.01)
 *H02P 25/02* (2006.01)

(52) U.S. Cl.
 CPC ............... *H02P 23/14* (2013.01); *G06F 11/00* (2013.01); *G06F 3/05* (2013.01); *G06F 19/00* (2013.01); *G01D 18/008* (2013.01); *H03M 1/10* (2013.01); *H02P 25/021* (2013.01)
 USPC .............. 702/85; 73/1.01; 327/362; 341/120; 341/126; 702/90; 702/107; 702/189; 708/200

(58) Field of Classification Search
 CPC ........... G01D 7/00; G01D 9/00; G01D 18/00; G01D 18/008; G01D 21/00; G06F 3/00; G06F 3/05; G06F 11/00; G06F 11/30; G06F 11/32; G06F 11/34; G06F 17/00; G06F 17/40; G06F 19/00; G06F 2011/00; H02P 23/00; H02P 23/14; H02P 24/00; H02P 24/02; H02P 25/021; H03M 1/00; H03M 1/10; H03M 2201/00; H03M 2201/20
 USPC ................ 73/1.01, 1.88, 432.1, 865.8, 865.9; 327/100, 334, 362; 341/118, 120, 121, 341/126, 155; 702/1, 85, 90, 104, 105, 107, 702/127, 182, 189; 708/100, 200, 204, 208
 See application file for complete search history.

(56) References Cited

U.S. PATENT DOCUMENTS 2,881,388 A * 4/1959 Behrend ........................ 324/612
3,082,374 A * 3/1963 Buuck ........................... 324/73.1

(Continued)

FOREIGN PATENT DOCUMENTS

CN 1975343 A 6/2007
CN 101750185 A 6/2010

*Primary Examiner* — Edward Cosimano
(74) *Attorney, Agent, or Firm* — Cantor Colburn LLP

(57) ABSTRACT

A system and a method of generating an external parameter value for a separately excited motor controller are disclosed, the system including: a digital signal processor to convert a received analog electrical signal into a digital signal and to scale the digital signal, so as to generate a parameter value in conformity with a data format of the system; an external parameter generating module to adjust the parameter value with a calibration coefficient to obtain the external parameter value; the calibration coefficient being generated by a calibration coefficient generating module and being pre-stored in a calibration coefficient storing module; and a calibration coefficient generating module to read the parameter value generated by the digital signal processor and obtain an actual measuring value as a reference parameter value, to calculate a difference value between the parameter value from the digital signal processor and the reference parameter value, and to generate the calibration coefficient from a ratio of the reference parameter value to the parameter value obtained from the digital signal processor if the difference value exceeds a preset value.

8 Claims, 2 Drawing Sheets

(56) References Cited

U.S. PATENT DOCUMENTS 3,349,195 A * 10/1967 Gray ............................. 324/537
3,510,770 A * 5/1970 Lowe ............................. 324/130
4,371,868 A * 2/1983 Van de Grift et al. ......... 341/120

* cited by examiner

SYSTEM AND METHOD OF GENERATING EXTERNAL PARAMETER VALUE FOR SEPARATELY EXCITED MOTOR CONTROLLER

CROSS REFERENCE TO RELATED APPLICATION

This application claims the benefit of priority to Chinese Patent Application No. 201010554589.1, entitled "SYSTEM AND METHOD OF GENERATING EXTERNAL PARAMETER VALUE FOR SEPARATELY EXCITED MOTOR CONTROLLER", filed on Nov. 22, 2010 with State Intellectual Property Office of PRC, which is incorporated herein by reference in its entirety.

TECHNICAL FIELD

The present invention refers to the field of vehicle, and more particularly, relates to a system and a method of generating an external parameter value for a separately excited motor controller.

BACKGROUND

Currently, new energy vehicle, due to its advantages such as energy-saving, environmental friendliness etc., has become one trend for development of the vehicle industry. Consequently, more and more attention has been paid on the development and design of motor controller, which is the core component of new energy vehicle.

The operation process of a motor controller is as follows: an external signal sensor converts an external parameter into an electrical signal, and then an external signal acquiring and processing circuit acquires and processes the electrical signal, and transfers the electrical signal to a digital signal processor. The digital signal processor converts the analog electrical signal to a digital signal by its analog-to-digital conversion module, so as to obtain an external parameter value. By means of the external parameter value, the motor controller performs a control according to a set policy, so as to drive the motor to operate.

In prior art, a solution to improve the accuracy of the external parameter value is employing high-precision sensors and signal acquiring and processing circuits constituted with high-precision devices. The accuracy of the external parameter value can be improved through improving the accuracy of the sensor and the devices in the signal acquiring and processing circuits.

However, in the solutions of the prior art, employing high-precision sensors and high-precision signal acquiring and processing circuits will increase the hardware cost and the complexity of the hardware circuits, which will adversely lower the reliability of the system.

BRIEF SUMMARY

In view of the above, an embodiment of the present invention provides a system of generating an external parameter value for a separately excited motor controller, to solve the problem existing in the prior art that when the accuracy of the external parameter value is improved, the hardware cost will be too high and the reliability of the system will be reduced.

The embodiment of the present invention is as follows:

A system of generating an external parameter value for a separately excited motor controller, includes a digital signal processor, a calibration coefficient generating module, a calibration coefficient storing module, and an external parameter generating module;

the digital signal processor is adapted to convert a received analog electrical signal into a digital signal and to scale the digital signal, so as to generate a parameter value in conformity with a data format of the system;

the external parameter generating module is adapted to adjust the parameter value with a calibration coefficient to obtain the external parameter value, the calibration coefficient being generated by the calibration coefficient generating module and being pre-stored in the calibration coefficient storing module; and the calibration coefficient generating module is adapted to read the parameter value generated by the digital signal processor and obtain an actual measuring value as a reference parameter value, to calculate a difference value between the parameter value from the digital signal processor and the reference parameter value, and to generate the calibration coefficient from a ratio of the reference parameter value to the parameter value obtained from the digital signal processor if the difference value exceeds a preset value.

Preferably, in the embodiment of the present invention, an analog-to-digital conversion module in the digital signal processor converts the electrical signal from the analog signal into the digital signal, and the digital signal is scaled to be in the data format required by the system of generating the external parameter value.

Preferably, in the embodiment of the present invention, the storage medium of the calibration coefficient storing module is an EPROM chip.

Preferably, in the embodiment of the present invention, the digital signal processor is connected with and in data communication with the EPROM chip via an external data bus.

Preferably, in the embodiment of the present invention, the parameter generating module reads the calibration coefficient in the calibration coefficient storing module via a Serial Communication Interface of the digital signal processor.

Preferably, in the embodiment of the present invention, the actual measuring value is sent through a RS232 interface circuit, a Serial Communication Interface (SCI) of the digital signal processor, into the calibration coefficient generating module, so as to obtain the calibration coefficient.

Preferably, in the embodiment of the present invention, the process of the calibration coefficient generating module sending the calibration coefficient to the calibration coefficient storing module is: the calibration coefficient generating module writing into the calibration coefficient storing module via a SPI of the digital signal processor.

In addition, the embodiments of the present invention further provide a method of generating an external parameter value for a separately excited motor controller, comprising the following steps:

reading in advance a parameter value generated by a digital signal processor, obtaining an actual measuring value as a reference parameter value, calculating a difference value between the parameter value from the digital signal processor and the reference parameter value, and generating a calibration coefficient from a ratio of the reference parameter value to the parameter value obtained from the digital signal processor if the difference value exceeds a preset value;

storing the calibration coefficient into the calibration coefficient storing module;

when generating the external parameter value, converting a received analog electrical signal into a digital signal, and scaling the digital signal, so as to generate a parameter value in conformity with a data format of the system; and adjusting the parameter value with the calibration coefficient to generate the external parameter value.

As may be seen from the technical solutions described above, in the embodiments of the present invention, a preset calibration coefficient for adjusting the parameter value is generated in advance from the difference value between the parameter value and the actual reference measuring value, which is calculated by the parameter generating module, and then is stored into the calibration coefficient storing module; when generating the external parameter value, the digital signal processor converts the received signal, which is a sensor signal acquired by the signal acquiring and processing module, into a parameter value in conformity with the data format of the system of generating the external parameter value. Then a higher-precision external parameter value can be obtained by correcting the deviation of the parameter value from the actual measuring value with the calibration efficient.

In the prior art, since the accuracy of the external parameter value is influenced directly by the precision of the sensor and the signal acquiring and processing module, high-precision sensor and signal acquiring and processing module are needed for obtaining accurate external parameter value.

In the embodiments of the invention, the accuracy of the obtained external parameter value can be improved effectively by correcting the accuracy error of the sensor and the signal acquiring and processing module. Hence, high-precision sensor and signal acquiring and processing module is not required for obtaining high-precision external parameter value, and the hardware cost is saved effectively, the complexity of the hardware circuit is reduced, and the reliability of the system is improved.

BRIEF DESCRIPTION OF THE DRAWINGS

Technical solutions of the embodiments of the present invention or the prior art will be illustrated more clearly with the following brief description of the drawings. Apparently, the drawings referred in the following description constitute only some embodiments of the invention. Those skilled in the art may obtain some other drawings from these drawings without any inventive labor.

DETAILED DESCRIPTION

The technical solutions of the embodiments of the present invention will be described clearly and completely in conjunction with the drawings. Apparently, the described embodiments are only some rather than all embodiments of the present invention. Any other embodiments obtained from the embodiments of the present invention by those skilled in the art without any inventive labor fall within the scope of the invention.

Figure 1:
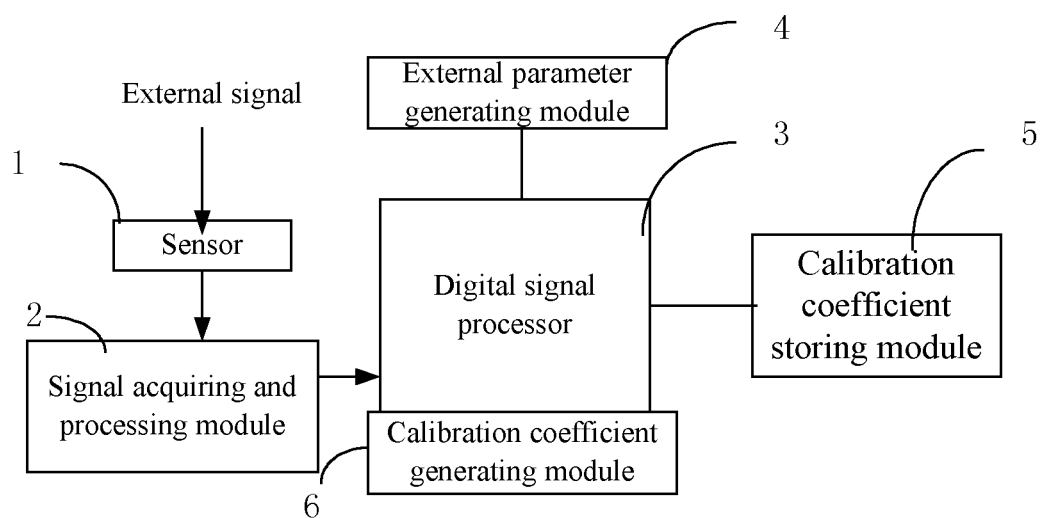
FIG. 1 is a schematic view of the structure of a system of generating an external parameter value for a separately excited motor controller.

An embodiment of the present invention discloses a system of generating an external parameter value for a separately excited motor controller, the specific structure of which is shown in FIG. 1. The system includes a digital signal processor 3, a calibration coefficient generating module 6, a calibration coefficient storing module 5, and an external parameter generating module 4.

The digital signal processor 3 is adapted to convert a received analog electrical signal into a digital signal, and to scale the digital signal, so as to generate a parameter value in conformity with the data format of the system.

In the embodiment of the present invention, a sensor 1 converts the detected external signal into an electrical signal, and then a signal acquiring and processing module 2 of the separately excited motor controller acquires and processes the electrical signal. Subsequently, the digital signal processor 3 converts the analog electrical signal into a digital signal and scales the digital signal, so as to obtain a parameter value in conformity with the data format of the system. In the embodiment of the present invention, an analog-to-digital conversion module in the digital signal processor 3 may perform the analog-to-digital conversion of the electrical signal.

Specifically, taking a throttle position sensor for example, once the throttle position sensor senses a signal representative of an open angle of the throttle, it converts the signal into an electrical signal, and then the signal acquiring and processing module samples the electrical signal. The digital signal processor converts the sampled electrical signal into a digital signal, and scales the digital signal so as to generate a parameter value.

In the prior art, at this point, the parameter value generated directly from the digital signal can function as the final external parameter value, the accuracy of which, however, is directly determined by the accuracy of the sensor and the signal acquiring and processing module. That is to say, the difference value resulted in relation to the accuracy of the sensor and the signal acquiring and processing module can be reflected directly into the parameter value generated from the digital signal. For example, after the signal is detected by the sensor and is acquired by the signal acquiring and processing module, assuming that the parameter value generated by the digital signal processor from the acquired electrical signal, has a difference value of 5% from the actual measuring value, in the prior art, the difference value between the external parameter value and the actual value is also 5%.

In the embodiment of the present invention, a calibration coefficient generating module 6 is provided, in which, the calibration coefficient is preset before use. In the embodiment of the present invention, while reading the parameter value, an actual measuring value is obtained and acts as a reference parameter value.

Specifically, taking a throttle position sensor as an example, when generating the calibration coefficient, the calibration coefficient generating module, on one hand, reads from the digital signal processor a parameter value, i.e. a value of the open angle of the throttle. On the other hand, at the same time, an actual measuring value of higher accuracy is measured by means of a high-precision sensor and a high-precision signal acquiring and processing module, and the actual measuring value is used as a reference measuring value, i.e. a value closer to the actual value of the open angle of the throttle.

Then, the calibration coefficient generating module 6 calculates the difference value between the parameter value and the actual reference measuring value obtained at the same time. If the difference value is greater than a preset value, the calibration coefficient generating module 6 calculates a calibration coefficient from the ratio of the actual measuring reference value to the parameter value, and sends the calibration coefficient to the calibration coefficient storing module 5. For example, assuming that the actual reference measuring value is 95, and the parameter value, which is converted by the digital signal processor from the electrical signal obtained by the sensor and the signal acquiring and the processing module 3, is 100, and assuming that the preset value of the difference is 3, it may be calculated that the difference value between the actual parameter value and the actual reference measuring value is 5, and at this time it may be determined that the signal acquired by the sensor 1 and the signal acquiring and processing module 2 has a relatively large error, and a calibration coefficient needs to be generated to adjust the external parameter value. In the case that actual measuring reference value is 95, and the signal value acquired by the sensor and the signal acquiring and processing module is 100, it may be calculated that the calibration coefficient is 95/100, i.e., 0.95.

The calibration coefficient storing module 5 is adapted to store the calibration coefficient.

In the embodiment of the present invention, the storage medium of the provided calibration coefficient storing module 5, which is adapted to store the calibration coefficient, may specifically be an EPROM chip. In the embodiment of the invention, the digital signal processor is connected with and in data communication with the EPROM chip via an external data bus, so the generated calibration coefficient may be stored by the calibration coefficient generating module 2 into the EPROM chip via the digital signal processor. Due to its small size, the EPROM chip is convenient to be integrated with other modules of the embodiment of the present invention. In addition, the data stored in the EPROM chip can be altered, thus the calibration coefficients stored therein can be altered and modified.

The parameter generating module 4 is adapted to receive the parameter value and read the preset calibration coefficient in the calibration coefficient storing module 5, and to adjust the parameter value with the preset calibration coefficient, so as to obtain an external parameter value.

In the embodiment of the present invention, a parameter generating module 4 is provided to correct the error in the signal acquired by the sensor 1 and the signal acquiring and processing module 2, so as to improve the data accuracy. The parameter generating module 4 receives the parameter value converted by the digital signal processor 3, and modifies the parameter value with the calibration coefficient. Specifically, in the embodiment of the present invention, the parameter generating module 4 receives the parameter value, reads the calibration coefficient from the calibration coefficient storing module 5, and modifies the parameter value with the calibration coefficient, so as to get an external parameter value. In the embodiment of the present invention, for the reason that the calibration coefficient is generated from the ratio of the actual measuring reference value to the parameter value, the external parameter value can be the result of multiplying the parameter value by the calibration coefficient. For instance, if the calibration coefficient is 0.95, and the parameter value of the digital signal received by the parameter generating module is 200, the parameter generating module may multiply the parameter value 200 by the calibration coefficient 0.95, and get the modified value 190, which is the final external parameter value.

In the embodiment of the present invention, the parameter value is converted from the electrical signal obtained by the sensor and the signal acquiring and processing module, and an error coefficient of the sensor and the signal acquiring and processing module and further the calibration coefficient may be obtained via the difference value between the parameter value and the actual measuring reference value. Accordingly, during the practical operation of the separately excited motor controller, the parameter value generated by the sensor and the signal acquiring and processing module can be modified, so that the error due to the inaccuracy of the sensor and the signal acquiring and processing module can be reduced effectively. Thus, the accuracy of the external parameter value can be improved without using sensors and signal acquiring and processing modules of higher accuracy. Consequently, the hardware costs can be saved effectively while improving the accuracy of the external parameter value.

In the embodiment described above, the parameter generating module 4 can read the calibration coefficient in the calibration coefficient storing module 5 via a serial peripheral interface (SPI) of the digital signal processor 3.

In the embodiment of the present invention, the digital signal processor 3 can also be provided with a Serial Peripheral Interface, thus the parameter generating module 4 can communicate with the digital signal processor 3 via the Serial Peripheral Interface thereof.

For the reason that the digital signal processor 3 is in connection with the calibration coefficient storing module 5, the parameter generating module 4 can read the calibration coefficient in the calibration coefficient storing module 5 via the serial peripheral interface of the digital signal processor 3.

It should be noted that as the skilled in the art would realize, the data communication between the digital signal processor and peripheral devices can be implemented through other interfaces provided on the digital signal processor, and the scope of the invention is limited by the embodiment adopting the Serial Peripheral Interface.

In the embodiment of the present invention, for the same reason that the digital signal processor 3 is in connection with the calibration coefficient storing module 5, the process of the calibration coefficient generating module 6 sending the calibration coefficient to the calibration coefficient storing module 5 can specifically be: the calibration coefficient generating module 6 writing the calibration coefficient into the calibration coefficient storing module 5 via SPI of the digital signal processor 3.

In the embodiment of the present invention, the communication with the calibration coefficient storing module is implemented via the SPI of the digital signal processor, to perform the write and read of the calibration coefficient. Thus the interface for directly communicating with the calibration coefficient storing module is eliminated, and the structure of the system of generating an external parameter value for the separately excited motor controller is simplified, and the cost for manufacturing the system is reduced.

Figure 2:
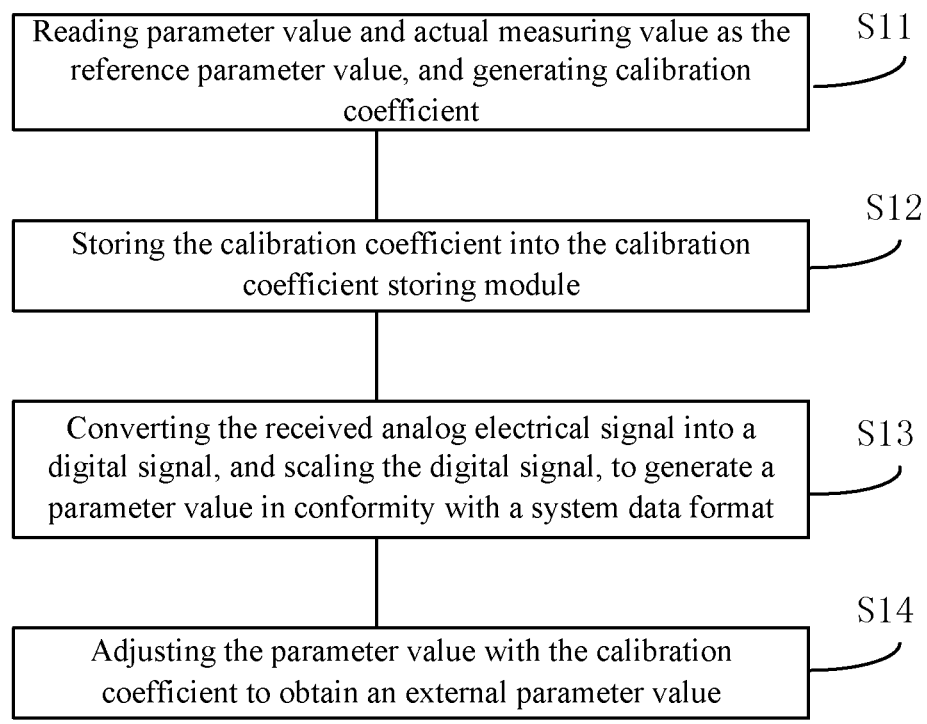
FIG. 2 is a flowchart of a method of generating an external parameter value for the separately excited motor controller.

In another embodiment of the present invention, a method of generating an external parameter value for a separately excited motor controller is provided. As shown in FIG. 2, the method includes the following steps:

S11, reading in advance a parameter value generated by a digital signal processor, and at the same time obtaining an actual measuring value for acting as a reference parameter value; calculating a difference value between the parameter value from the digital signal processor and the reference parameter value; if the difference value exceeds a preset value, generating a calibration coefficient from a ratio of the reference parameter value to the parameter value obtained from the digital signal processor.

In the embodiment of the invention, the process of reading in advance the parameter value generated by the digital signal processor is as follows:

a sensor converting a detected signal into an electrical signal, then a signal acquiring and processing module in the separately excited motor controller acquiring and processing the electrical signal, subsequently, and subsequently the digital signal processor converting the analog electrical signal into a digital signal, and scaling the digital signal so as to obtain a parameter value in conformity with the data format of the system.

Specifically, taking a throttle position sensor as an example, once the throttle position sensor senses a signal representative of an open angle of the throttle, it converts the signal into an electrical signal, and then the signal acquiring and processing module samples the electrical signal. The digital signal processor converts the sampled electrical signal into a digital signal, and scales the digital signal so as to generate a parameter value.

In the prior art, at this point, the parameter value generated directly from the digital signal can function as the final external parameter value, the accuracy of which, however, is directly determined by the accuracy of the sensor and the signal acquiring and processing module. That is to say, the difference value resulted in relation to the accuracy of the sensor and the signal acquiring and processing module can be reflected directly into the parameter value generated from the digital signal, i.e. the final external parameter value in the prior art. For example, after the signal is detected by the sensor and is acquired by the signal acquiring and processing module, assuming that the parameter value generated by the digital signal processor from the acquired electrical signal, has a difference value of 5% from the actual measuring value, in the prior art, the difference value between the external parameter value and the actual value is also 5%.

In the embodiment of the present invention, to make the obtained parameter value closer to the actual value, an actual measuring value of higher accuracy is then obtained by a high-precision sensor and a high-precision signal acquiring and processing module, and the actual measuring value acts as a reference measuring value, which is the value closer to the actual value of the open angle of the throttle.

Subsequently, a calibration coefficient generating module reads the parameter value from the digital signal processor, takes the actual measuring value as the reference parameter value, and then calculates a difference value between the parameter value from the digital signal processor and the reference parameter value. If the difference value exceeds the preset value, a calibration coefficient is generated by the ratio of the reference parameter value to the parameter value from the digital signal processor.

Specifically, the calibration coefficient generating module calculates the difference value between the parameter value and the actual reference measuring value obtained at the same time. If the difference value is greater than a preset value, the calibration coefficient generating module calculates the calibration coefficient from the ratio of the actual measuring reference value to the parameter value, and sends the calibration coefficient to a calibration coefficient storing module. For example, assuming that the actual reference measuring value is 95, and the parameter value, which is converted by the digital signal processor from the electrical signal obtained by the sensor and the signal acquiring and the processing module, is 100, and assuming that the preset value of the difference is 3, it may be calculated that the difference value between the actual parameter value and the actual reference measuring value is 5, and at this time it may be determined that the signal acquired by the sensor and the signal acquiring and processing module has a relatively large error, and a calibration coefficient needs to be generated to adjust the external parameter value. In the case that actual measuring reference value is 95, and the signal value acquired by the sensor and the signal acquiring and processing module is 100, it may be calculated that the calibration coefficient is 95/100, i.e., 0.95.

S12, the calibration coefficient storing module storing the calibration coefficient generated by the calibration coefficient generating module.

In the embodiment of the present invention, the storage medium of the provided calibration coefficient storing module, which is adapted to store the calibration coefficient, may specifically be an EPROM chip. In the embodiment of the invention, the digital signal processor is connected with and in data communication with the EPROM chip via an external data bus, so the generated calibration coefficient may be stored by the calibration coefficient generating module into the EPROM chip via the digital signal processor. Due to its small size, the EPROM chip is convenient to be integrated with other modules of the embodiment of the present invention. In addition, the data stored in the EPROM chip can be altered, thus the calibration coefficients stored therein can be altered and modified.

S13, in practical applications, after finishing the above steps, when an external parameter value is needed, at first converting the received analog electrical signal into a digital signal, and scaling the digital signal to generate a parameter value in conformity with the data format of the system.

S14, then using the calibration coefficient to adjust the parameter value to generate the external parameter value.

In the embodiment of the invention, the process of generating the parameter value in the step S13 is similar to that in the step S11, which will be not described herein.

After generating the parameter value in S13, the parameter value generated directly from the digital signal can be the final external parameter value in the prior art, the accuracy of which, however, is directly determined by the accuracy of the sensor and the signal acquiring and processing module. That is to say, the difference value resulted in relation to the accuracy of the sensor and the signal acquiring and processing module can be reflected directly into the parameter value generated from the digital signal, which is the final external parameter value in the prior art. For example, after the signal is detected by the sensor and is acquired by the signal acquiring and processing module, assuming that the parameter value generated by the digital signal processor from the acquired electrical signal, has a difference value of 5% from the actual measuring value, in the prior art, the difference value between the external parameter value and the actual value is also 5%.

To improve the accuracy of the finally generated external parameter value, in the embodiment of the present invention, after the parameter generating module receives the parameter value and reads the calibration coefficient preset in the calibration coefficient storing module, the calibration coefficient is used to adjust the parameter value to obtain the external parameter value.

In the embodiment of the invention, the parameter generating module is able to correct the error in the signal acquired by the sensor and the signal acquiring and processing module, so as to improve the data accuracy. The parameter generating module receives the parameter value converted by the digital signal processor, and modifies the parameter value by using the calibration coefficient.

Specifically, in the embodiment of the present invention, the parameter generating module receives the parameter value, reads the calibration coefficient from the calibration coefficient storing module, and modifies the parameter value with the calibration coefficient, so as to get the external parameter value. In the embodiment of the present invention, for the reason that the calibration coefficient is generated from the ratio of the actual measuring reference value to the parameter value, the external parameter value can be the result of multiplying the parameter value by the calibration coefficient. For instance, if the calibration coefficient is 0.95, and the parameter value of the digital signal received by the parameter generating module is 200, the parameter generating module may multiply the parameter value 200 by the calibration coefficient 0.95, and get the modified value 190, which is the final external parameter value.

The embodiments of the invention are described in a progressive way, each of which emphasizes the differences from others, and the same or similar elements among the embodiments can be referred to each other. Since the system disclosed in the embodiments corresponds to the method therein, the description thereof is relatively simple, and for relevant matters references may be made to the description of the method.

It should be understood by the skilled in the art that any of many different processes and technologies can be employed to represent information, messages and signals. For instance, the information and messages mentioned above can be represented by voltages, currents, electromagnetic waves, magnetic fields or magnetic particles, optical fields or any combination thereof.

The skilled in the art should further realize that various units and algorithm steps described in connection with the disclosed embodiments herein may be implemented in electronic hardware, computer software, or the combination thereof, or may be implemented in embedded software or a combination of embedded software and electronic hardware. To illustrate the interchangeable usage of hardware and software, the above description has shown, in a general way, the configurations and the steps of various embodiments in terms of functions. Whether these functions are implemented in hardware or software depends on particular applications and design constraints of respective solutions. The skilled in the art can implement the described functions in different ways for different applications, and the implementations should not be regarded as falling without the scope of the invention.

The skilled in the art can understand that all or part of the flows of the exemplary methods can be implemented with related hardware by following instructions of computer programs, in which the programs can be stored in a computer readable storage medium. When executed, the programs can implement the flows of the various methods. The storage medium can be a magnetic disk, an optical disk, a Read-Only Memory (ROM), or a Random Access Memory (RAM), etc.

With the above descriptions of the disclosed embodiments, the skilled in the art may practice or use the present invention. Various modifications to the embodiments are apparent for the skilled in the art. The general principle suggested herein can be implemented in other embodiments without departing from the spirit or scope of the invention. Therefore, the present invention should not be limited by the embodiments disclosed herein, but has the widest scope that is conformity with the principle and the novel features disclosed herein.

What is claimed is:

1. A system of generating an external parameter value for a separately excited motor controller, comprising a digital signal processor, a calibration coefficient generating module, a calibration coefficient storing module, and an external parameter generating module, wherein:
    the digital signal processor is adapted to convert a received analog electrical signal into a digital signal and to scale the digital signal, so as to generate a parameter value in conformity with a data format of the system;
    the external parameter generating module is adapted to adjust the parameter value with a calibration coefficient to obtain an external parameter value, the calibration coefficient being generated by the calibration coefficient generating module and being pre-stored in the calibration coefficient storing module; and
    the calibration coefficient generating module is adapted to read the parameter value generated by the digital signal processor and at the same time obtain an actual measuring value as a reference parameter value, to calculate a difference value between the parameter value from the digital signal processor and the reference parameter value, and to generate the calibration coefficient from a ratio of the reference parameter value to the parameter value obtained from the digital signal processor if the difference value exceeds a preset value.

2. The system according to claim 1, wherein an analog-to-digital conversion module in the digital signal processor converts the electrical signal from the analog signal into the digital signal, and the digital signal is scaled to be in the data format required by the system of generating the external parameter value.

3. The system according to claim 1, wherein the actual measuring value is sent through a RS232 interface circuit, a Serial Communication Interface (SCI) of the digital signal processor, into the calibration coefficient generating module, so as to obtain the calibration coefficient.

4. The system according to claim 1, wherein the process of the calibration coefficient generating module sending the calibration coefficient to the calibration coefficient storing module is: the calibration coefficient generating module writing into the calibration coefficient storing module via a SPI of the digital signal processor.

5. The system according to claim 1, wherein the storage medium of the calibration coefficient storing module is an EPROM chip.

6. The system according to claim 5, wherein the digital signal processor is connected with and in data communication with the EPROM chip via an external data bus.

7. The system according to claim 6, wherein the parameter generating module reads the calibration coefficient in the calibration coefficient storing module via a Serial Communication Interface of the digital signal processor.

8. A method of generating an external parameter value for a separately excited motor controller, comprising the following steps:
    reading in advance a parameter value generated by a digital signal processor, obtaining an actual measuring value as a reference parameter value, calculating a difference value between the parameter value from the digital signal processor and the reference parameter value, and generating a calibration coefficient from a ratio of the reference parameter value to the parameter value obtained from the digital signal processor if the difference value exceeds a preset value;
    storing the calibration coefficient into the calibration coefficient storing module;
    when generating the external parameter value, converting a received analog electrical signal into a digital signal, and scaling the digital signal, so as to generate a parameter value in conformity with a data format of the system; and
    adjusting the parameter value with the calibration coefficient to generate the external parameter value.

* * * * *